US009589962B2

(12) United States Patent
Tang et al.

(10) Patent No.: US 9,589,962 B2
(45) Date of Patent: Mar. 7, 2017

(54) ARRAY OF CONDUCTIVE VIAS, METHODS OF FORMING A MEMORY ARRAY, AND METHODS OF FORMING CONDUCTIVE VIAS

(71) Applicant: Micron Technology, Inc., Boise, ID (US)

(72) Inventors: Sanh D. Tang, Boise, ID (US); Wolfgang Mueller, Garden City, ID (US); Brent Gilgen, Boise, ID (US); Dylan R. Macmaster, Boise, ID (US); Jim A. Jozwiak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 14/307,121

(22) Filed: Jun. 17, 2014

(65) Prior Publication Data
US 2015/0364414 A1 Dec. 17, 2015

(51) Int. Cl.
*H01L 21/768* (2006.01)
*H01L 27/108* (2006.01)
*H01L 49/02* (2006.01)
*H01L 21/3213* (2006.01)

(52) U.S. Cl.
CPC ...... *H01L 27/108* (2013.01); *H01L 21/32133* (2013.01); *H01L 21/76885* (2013.01); *H01L 21/76895* (2013.01); *H01L 21/76897* (2013.01); *H01L 27/10855* (2013.01); *H01L 28/60* (2013.01); *H01L 28/90* (2013.01)

(58) Field of Classification Search
CPC ........... H01L 21/76895; H01L 23/5226; H01L 23/528; H01L 28/60; H01L 28/90; H01L 21/32133; H01L 27/108; H01L 27/10855; H01L 21/76997
See application file for complete search history.

(56) References Cited

U.S. PATENT DOCUMENTS

| 4,651,183 A | 3/1987 | Lange et al. |
| 4,791,463 A | 12/1988 | Malhi |
| 5,392,189 A * | 2/1995 | Fazan ............... H01L 21/76849 257/306 |
| 5,686,337 A * | 11/1997 | Koh ................. H01L 27/10852 257/E21.648 |

(Continued)

*Primary Examiner* — Savitr Mulpuri
(74) *Attorney, Agent, or Firm* — Wells St. John, P.S.

(57) ABSTRACT

A method of forming conductive vias comprises forming at least three parallel line constructions elevationally over a substrate. The line constructions individually comprise a dielectric top and dielectric sidewalls. A conductive line is formed elevationally over and angles relative to the line constructions. The conductive line comprises a longitudinally continuous portion and a plurality of conductive material extensions that individually extend elevationally inward between immediately adjacent of the line constructions. Etching is conducted elevationally through the longitudinally continuous portion and partially elevationally into the extensions at spaced locations along the conductive line to break-up the longitudinally continuous portion to form individual conductive vias extending elevationally between immediately adjacent of the line constructions. Methods of forming a memory array are also disclosed. Arrays of conductive vias independent of method of manufacture are also disclosed.

30 Claims, 8 Drawing Sheets

(56) References Cited

U.S. PATENT DOCUMENTS

| | | | |
|---|---|---|---|
| 5,864,181 A | 1/1999 | Keeth | |
| 6,184,081 B1* | 2/2001 | Jeng | H01L 21/76831 257/E21.011 |
| 6,204,527 B1* | 3/2001 | Sudo | H01L 27/10867 257/301 |
| 6,410,948 B1 | 6/2002 | Tran et al. | |
| 6,525,360 B2 | 2/2003 | Kajiyama et al. | |
| 6,734,482 B1* | 5/2004 | Tran | H01L 27/10814 257/296 |
| 6,936,891 B2 | 8/2005 | Saito et al. | |
| 6,992,343 B2 | 1/2006 | Miyatake et al. | |
| 7,285,812 B2* | 10/2007 | Tang | H01L 21/28132 257/296 |
| 7,291,533 B2 | 11/2007 | von Schwerin | |
| 7,349,232 B2 | 3/2008 | Wang et al. | |
| 7,902,026 B2 | 3/2011 | Chung et al. | |
| 7,968,928 B2 | 6/2011 | Abbott | |
| 8,143,121 B2 | 3/2012 | Lin | |
| 8,207,485 B2* | 6/2012 | LePage | H01L 27/14603 250/208.1 |
| 8,497,541 B2 | 7/2013 | Parekh et al. | |
| 8,617,952 B2 | 12/2013 | Kim et al. | |
| 8,691,680 B2 | 4/2014 | Wang | |
| 2004/0164360 A1* | 8/2004 | Nishida | G11C 11/4125 257/393 |
| 2005/0199912 A1 | 9/2005 | Hofmann et al. | |
| 2006/0086960 A1* | 4/2006 | Arai | H01L 27/10852 257/303 |
| 2007/0082448 A1 | 4/2007 | Kim et al. | |
| 2007/0181925 A1 | 8/2007 | Yoon et al. | |
| 2007/0187736 A1 | 8/2007 | Akiyama et al. | |
| 2007/0228434 A1 | 10/2007 | Shimojo | |
| 2008/0185683 A1 | 8/2008 | Ohuchi | |
| 2009/0140342 A1 | 6/2009 | Chakihara et al. | |
| 2010/0052027 A1 | 3/2010 | Abbott et al. | |
| 2010/0097835 A1 | 4/2010 | Popp et al. | |
| 2010/0244271 A1 | 9/2010 | Ujihara | |
| 2010/0248469 A1 | 9/2010 | Kim | |
| 2011/0111568 A1 | 5/2011 | Kim et al. | |
| 2011/0156118 A1 | 6/2011 | Park | |
| 2011/0198758 A1 | 8/2011 | Jeon et al. | |
| 2011/0217819 A1 | 9/2011 | Abbott | |
| 2011/0284939 A1 | 11/2011 | Chung et al. | |
| 2012/0001346 A1 | 1/2012 | Kim et al. | |
| 2012/0007186 A1 | 1/2012 | Seo | |
| 2012/0056255 A1 | 3/2012 | Sukekawa | |
| 2012/0104491 A1 | 5/2012 | Heineck et al. | |
| 2012/0112270 A1 | 5/2012 | Park et al. | |
| 2012/0119278 A1 | 5/2012 | Mikasa | |
| 2012/0243313 A1 | 9/2012 | Cai et al. | |
| 2013/0015551 A1 | 1/2013 | Wang | |
| 2013/0032879 A1 | 2/2013 | Lee | |
| 2013/0049110 A1 | 2/2013 | Wang et al. | |
| 2013/0234282 A1 | 9/2013 | Park | |
| 2013/0235642 A1 | 9/2013 | Heineck et al. | |
| 2013/0320442 A1 | 12/2013 | Liao et al. | |

* cited by examiner

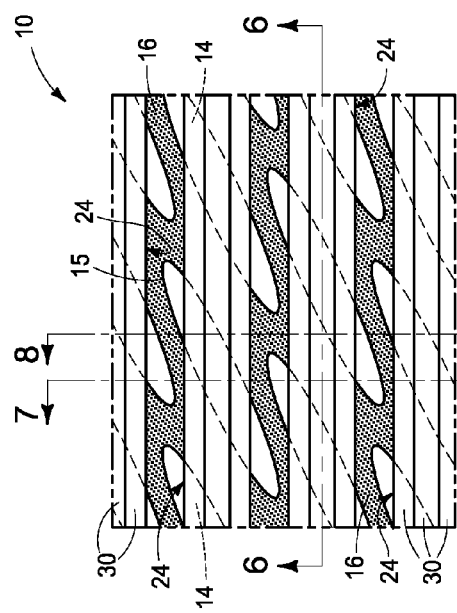
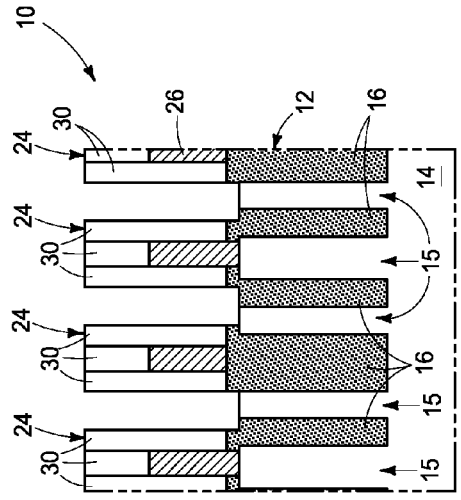
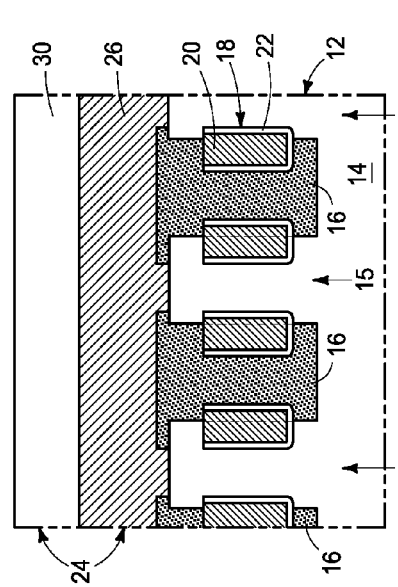
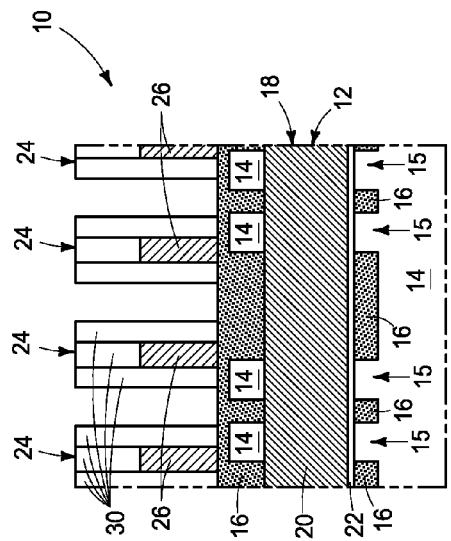

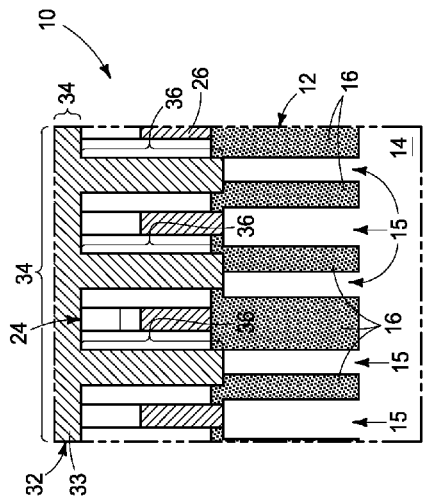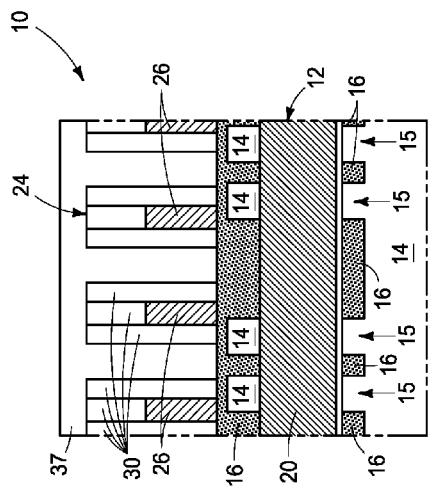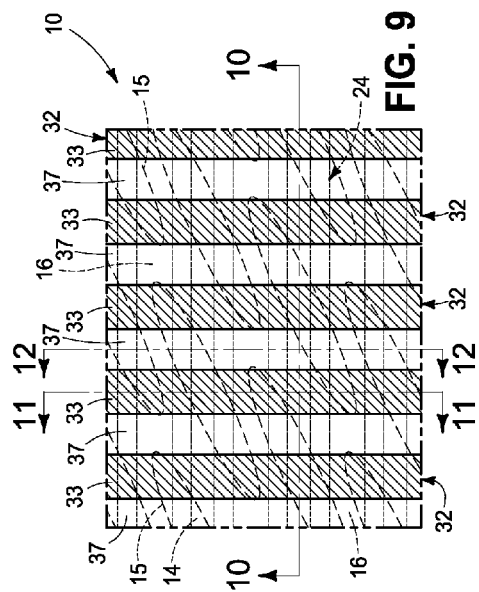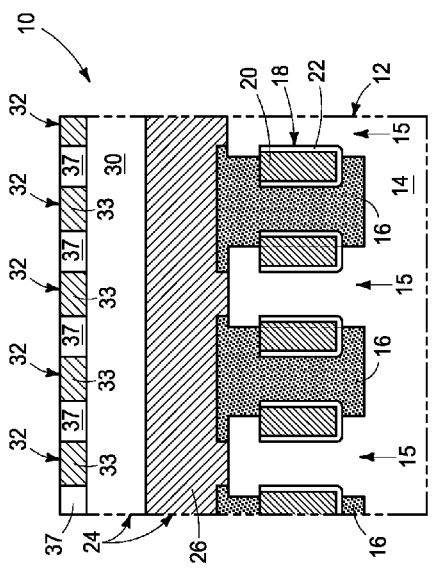

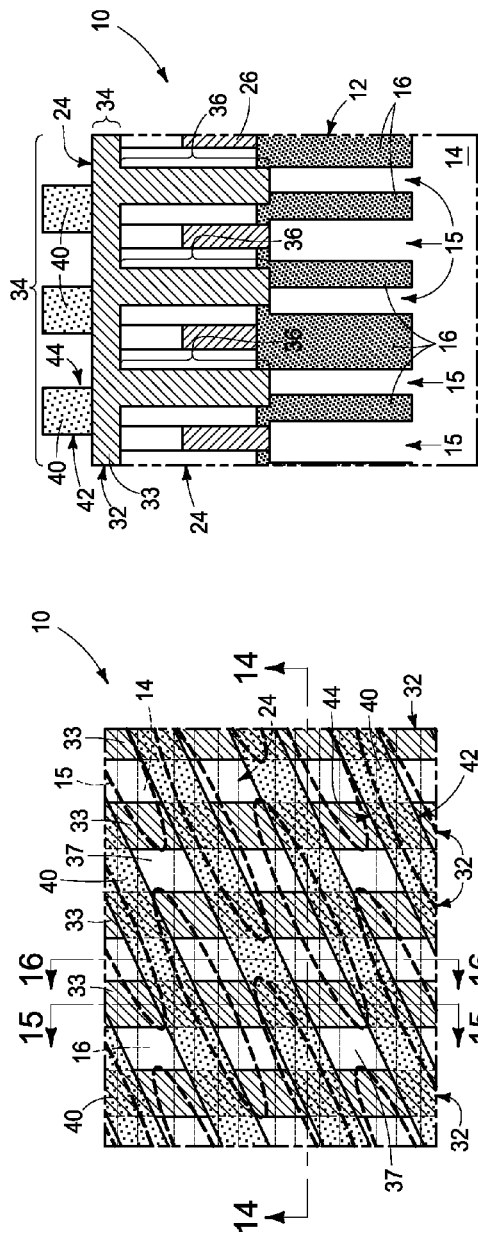
FIG. 13
FIG. 15
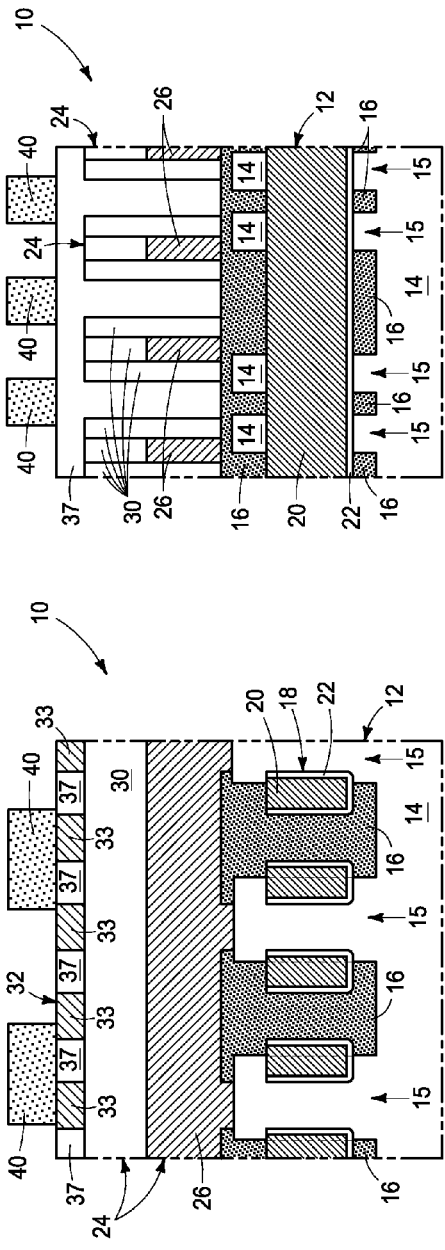
FIG. 14
FIG. 16

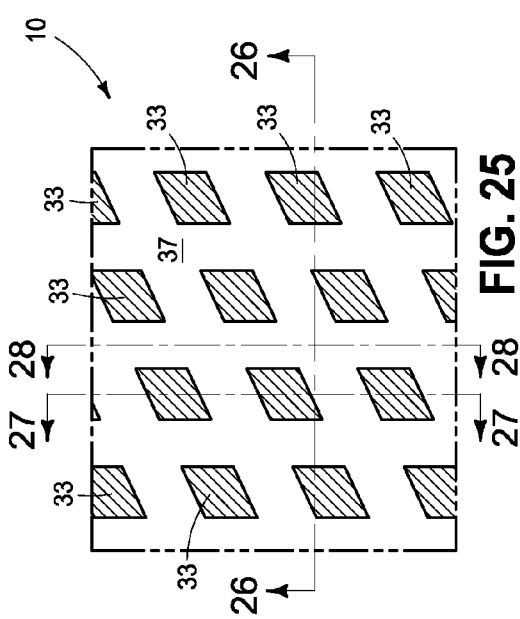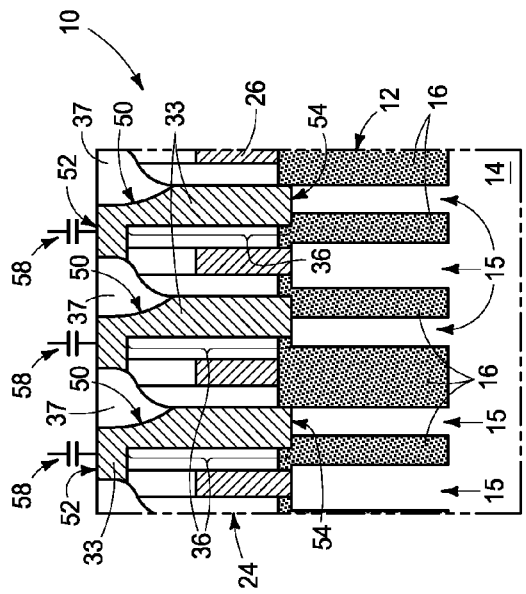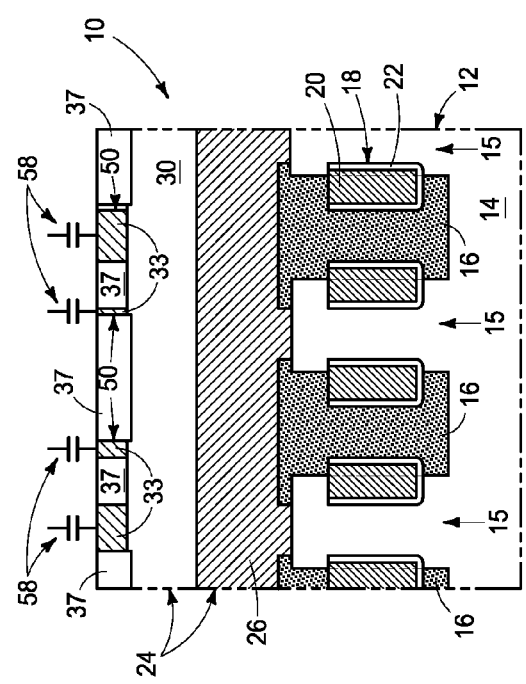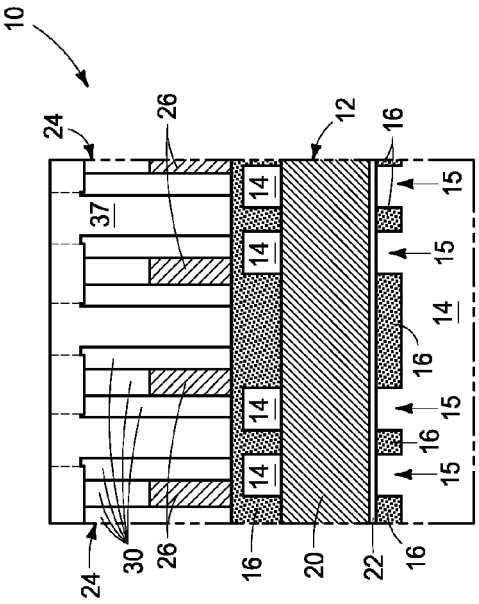

ARRAY OF CONDUCTIVE VIAS, METHODS OF FORMING A MEMORY ARRAY, AND METHODS OF FORMING CONDUCTIVE VIAS

TECHNICAL FIELD

Embodiments disclosed herein pertain to arrays of conductive vias, to methods of forming a memory array, and to methods of forming conductive vias.

BACKGROUND

A continuing goal in integrated circuitry fabrication is to make ever smaller and closer packed circuit components. As integrated circuitry density has increased, there is often greater reduction in the horizontal dimension of circuit components as compared to the vertical dimension. In many instances, the vertical dimension has increased. As size decreases and density increases, there is a continuing challenge to provide sufficient conductive contact area between electrically coupled circuit components particularly where that coupling is through contacting surfaces that are substantially horizontal. For example, elevationally elongated conductive vias formed in contact openings are commonly used for electrically coupling circuit components that are at different elevations relative to one another. As circuit components become smaller and closer together, it becomes increasingly difficult to control critical dimension, mask alignment, and provide acceptable margins of error when forming contact openings to lower elevation circuit components. In some instances after forming conductive vias, additional conductive material is deposited directly against the vias and is subsequently patterned to enlarge targeting area and/or provide greater conductivity for overlying devices that electrically couple to the vias.

Memory is one type of integrated circuitry commonly incorporating conductive vias. Integrated memory is usually fabricated in one or more arrays of individual memory cells. The memory cells might be volatile, semi-volatile, or non-volatile. Nonvolatile memory cells can store data for extended periods of time in the absence of power. Nonvolatile memory is conventionally specified to be memory having a retention time of at least about 10 years. Volatile memory dissipates, and is therefore refreshed/rewritten to maintain data storage. Volatile memory may have a retention time of milliseconds, or less. The memory cells are configured to retain or store memory in at least two different selectable states. In a binary system, the states are considered as either a "0" or a "1". In other systems, at least some individual memory cells may be configured to store more than two levels or states of information.

BRIEF DESCRIPTION OF THE DRAWINGS

FIG. 5 is a view of the FIG. 1 substrate at a processing step subsequent to that shown by FIG. 1.

FIG. 6 is a diagrammatic sectional view taken through line 6-6 in FIG. 5.

FIG. 7 is a diagrammatic sectional view taken through line 7-7 in FIG. 5.

FIG. 8 is a diagrammatic sectional view taken through line 8-8 in FIG. 5.

FIG. 9 is a view of the FIG. 5 substrate at a processing step subsequent to that shown by FIG. 5.

FIG. 10 is a diagrammatic sectional view taken through line 10-10 in FIG. 9.

FIG. 11 is a diagrammatic sectional view taken through line 11-11 in FIG. 9.

FIG. 12 is a diagrammatic sectional view taken through line 12-12 in FIG. 9.

FIG. 13 is a view of the FIG. 9 substrate at a processing step subsequent to that shown by FIG. 9.

FIG. 14 is a diagrammatic sectional view taken through line 14-14 in FIG. 13.

FIG. 15 is a diagrammatic sectional view taken through line 15-15 in FIG. 13.

FIG. 16 is a diagrammatic sectional view taken through line 16-16 in FIG. 13.

FIG. 25 is a view of the FIG. 21 substrate at a processing step subsequent to that shown by FIG. 21.

FIG. 26 is a diagrammatic hybrid schematic and structural sectional view taken through line 26-26 in FIG. 25.

FIG. 27 is a diagrammatic hybrid schematic and structural sectional view taken through line 27-27 in FIG. 25.

FIG. 28 is a diagrammatic sectional view taken through line 28-28 in FIG. 25.

DETAILED DESCRIPTION OF EXAMPLE EMBODIMENTS

Figure 1:
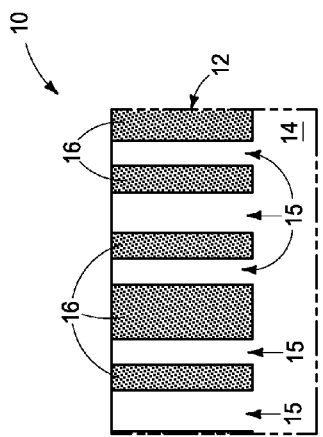
FIG. 1 is a diagrammatic top plan view of a substrate fragment in process accordance with an embodiment of the invention.
Figure 2:
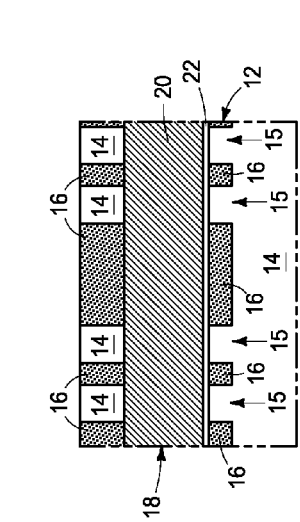
FIG. 2 is a diagrammatic sectional view taken through line 2-2 in FIG. 1.
Figure 3:
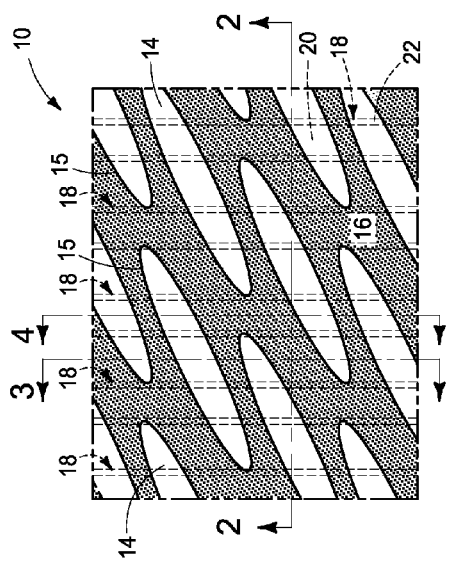
FIG. 3 is a diagrammatic sectional view taken through line 3-3 in FIG. 1.
Figure 4:
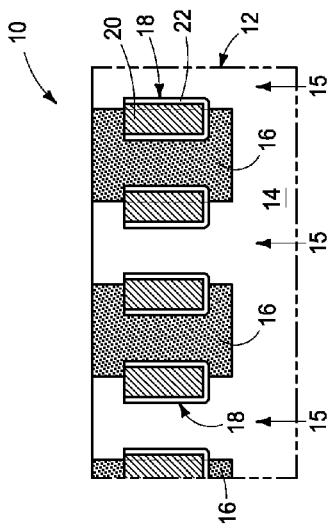
FIG. 4 is a diagrammatic sectional view taken through line 4-4 in FIG. 1.
Figure 17:
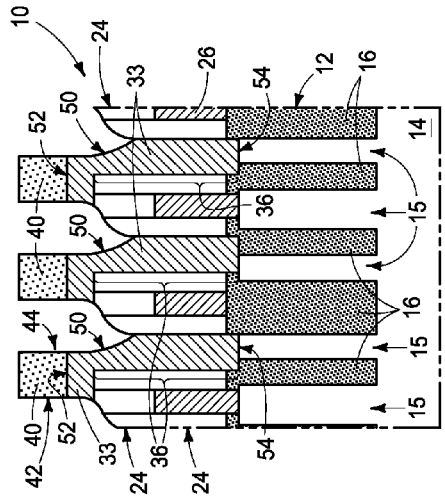
FIG. 17 is a view of the FIG. 13 substrate at a processing step subsequent to that shown by FIG. 13.
Figure 19:
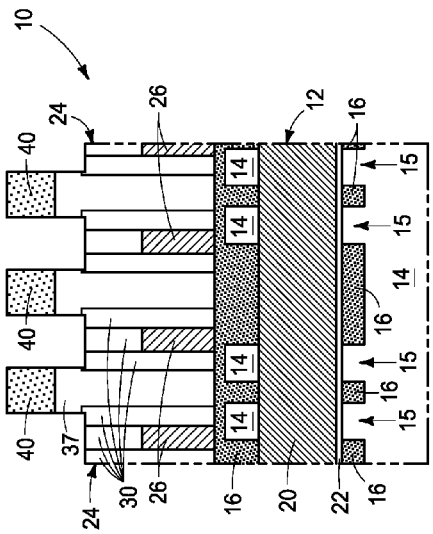
FIG. 19 is a diagrammatic sectional view taken through line 19-19 in FIG. 17.
Figure 18:
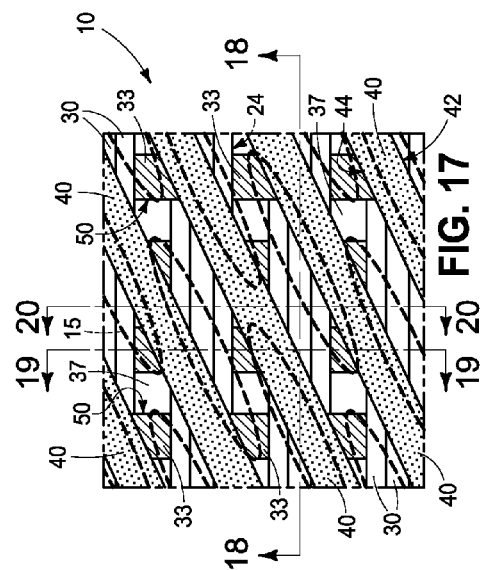
FIG. 18 is a diagrammatic sectional view taken through line 18-18 in FIG. 17.
Figure 20:
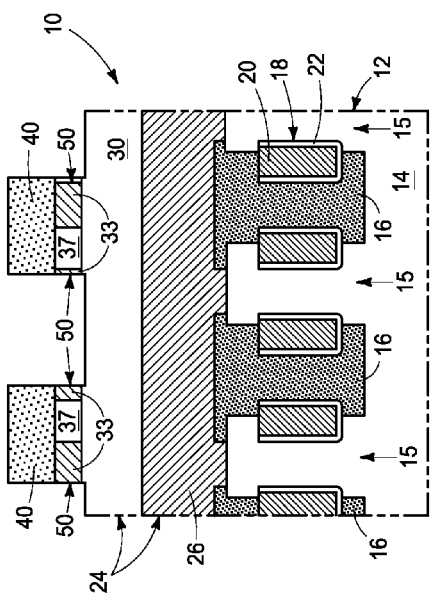
FIG. 20 is a diagrammatic sectional view taken through line 20-20 in FIG. 17.
Figure 21:
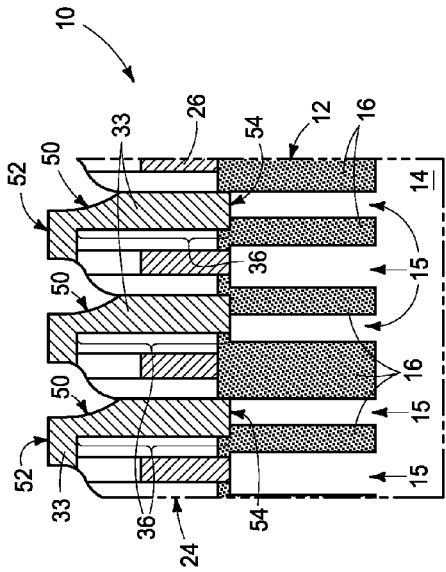
FIG. 21 is a view of the FIG. 17 substrate at a processing step subsequent to that shown by FIG. 17.
Figure 23:
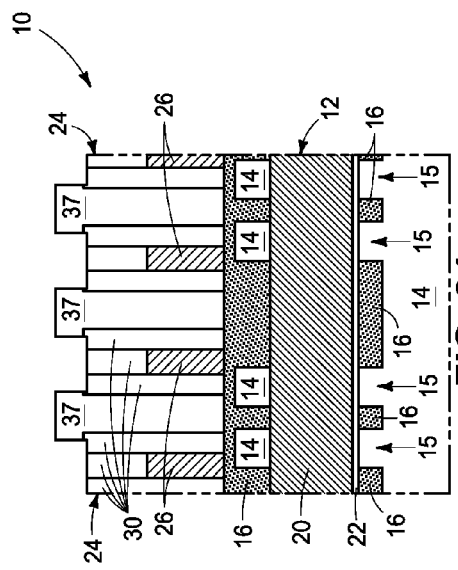
FIG. 23 is a diagrammatic sectional view taken through line 23-23 in FIG. 21.
Figure 22:
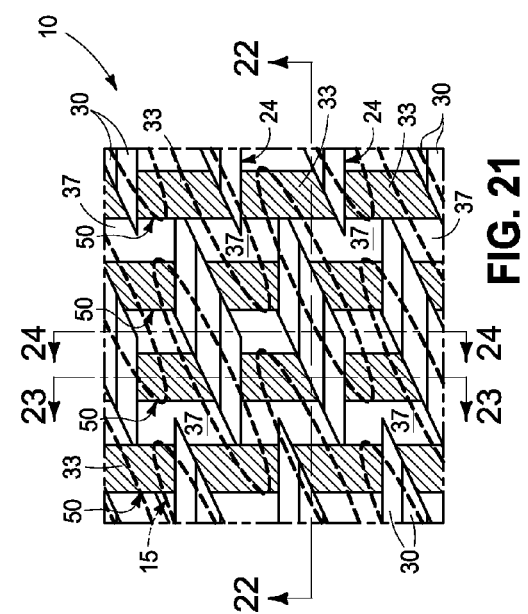
FIG. 22 is a diagrammatic sectional view taken through line 22-22 in FIG. 21.
Figure 24:
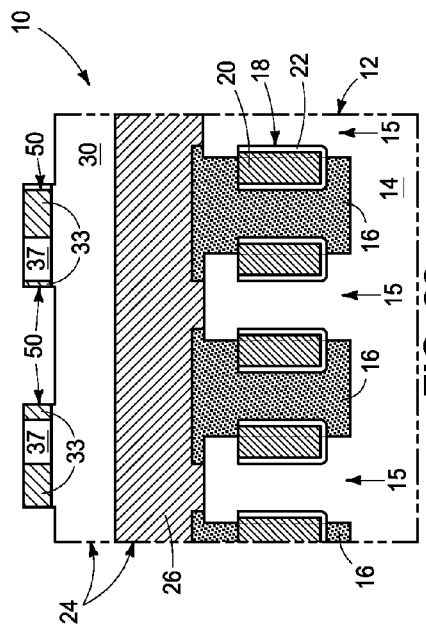
FIG. 24 is a diagrammatic sectional view taken through line 24-24 in FIG. 21.

Example methods of forming a memory array in accordance with some embodiments of the invention are initially described with reference to FIGS. 1-28. FIGS. 1-4 show a small portion of a memory array in fabrication relative to a substrate fragment 10. Control and/or other peripheral circuitry for operating components within the memory array may also be fabricated, and may or may not wholly or partially be within a memory array or sub-array. Further, multiple sub-arrays may also be fabricated and operated independently, in tandem, or otherwise relative one another. As used in this document, a "sub-array" may also be considered as an array. Substrate 10 may be a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 10 comprises base substrate or material 12. Partially or wholly fabricated components of integrated circuitry may be formed as part of, or be elevationally inward of, base substrate 12. Example base substrate 12 comprises bulk semiconductive material 14 having isolation regions 16 formed therein. Semiconductor-on-insulator and other constructions may be used, and whether existing or yet-to-be-developed. Example semiconductive material 14 comprises suitably background doped monocrystalline silicon. Example isolation material 16 comprises doped or undoped silicon dioxide, and/or silicon nitride. Substrate material 14 between isolation regions 16 may be considered as active area 15.

Any of the materials and/or structures described herein may be homogenous or non-homogenous, and regardless may be continuous or discontinuous over any material that such overlie. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

Row line constructions 18 have been formed relative to substrate 12. Example row line constructions 18 comprise conductive (i.e., electrically) material 20 having gate dielectric 22 formed about the base and sidewalls thereof. Example compositions for conductive material 20 are elemental metals, a mixture or alloy of two or more elementals, conductive metal compounds, and conductively-doped semiconductive materials. Example compositions for gate dielectric 22 include silicon dioxide, silicon nitride, high-k dielectrics, ferroelectrics, etc. An example thickness for gate dielectric 22 is about 25 to 70 Angstroms, while an example elevational thickness for conductive material 20 is about 500 to 1,000 Angstroms. In this document, "thickness" by itself (no preceding directional adjective) is the mean straight-line distance through a given material or region perpendicularly from a closest surface of an immediately adjacent material of different composition or of an immediately adjacent region. Additionally, the various materials described herein may be of substantially constant thickness or of variable thicknesses. If of variable thickness, thickness refers to average thickness. In this document, "elevational", "upper", "lower", "top", and "bottom" are with reference to the vertical direction. "Horizontal" refers to a general direction along a primary surface relative to which the substrate is processed during fabrication, and vertical is a direction generally orthogonal thereto. Further, "vertical" and "horizontal" as used herein are generally perpendicular directions relative one another and independent of orientation of the substrate in three-dimensional space.

Referring to FIGS. 5-8, column line constructions 24 have been formed relative to substrate 12 elevationally outward of row line constructions 18. Column line constructions 24 and row line constructions 18 angle (i.e., other than the straight angle) relative one another. Column line constructions 24 individually comprise a conductive core 26 and dielectric 30 over a top and sidewalls thereof. Example conductive core materials are those described above for conductive material 20. Example dielectric materials 30 are those described above for isolation regions 16.

Row line constructions 18 may be considered and/or function as access lines. Column line constructions 24 may be considered and/or function as sense lines. However, use of "row" and "column" in this document is for convenience in distinguishing one series of lines from another series of lines. Accordingly, "row" and "column" are intended to be synonymous with any series of lines independent of function. Regardless, the rows may be straight and/or curved and/or parallel and/or not parallel relative one another, as may be the columns. Further, the rows and columns may intersect relative one another at 90° or at one or more other angles. In the depicted example, each of the row lines and column lines are shown as being individually straight and angling relative one another at 90°. In one embodiment and as shown, column line constructions 24 are formed to angle perpendicularly (i.e., within 5° of 90°) relative to row line constructions 18. In one embodiment and as shown, conductive core material 26 may extend elevationally inward to a respective longitudinal central portion of each active area 15. An example maximum elevational thickness for conductive core material 26 is about 300 to 1,000 Angstroms.

Referring to FIGS. 9-12, conductive lines 32 have been formed elevationally over and angle relative to column line constructions 24. Conductive lines 32 comprise conductive material 33, with examples being those described above for material 20. Conductive lines 32 individually comprise a longitudinally continuous portion 34 and a plurality of conductive material extensions 36 that individually extend elevationally inward between immediately adjacent column line constructions 24 to electrically couple to substrate active area 15.

In one embodiment, conductive lines 32 are formed parallel relative to row line constructions 18. In one embodiment, at least a majority of all conductive material 33 of conductive lines 32 is between immediately adjacent of row line constructions 18 elevationally outward of row line constructions 18. In one embodiment, conductive lines 32 are formed to angle perpendicularly relative to column line constructions 24. In one embodiment, all conductive material 33 of individual conductive lines 32 is formed to be homogenous. In one embodiment, conductive lines 32 are formed to be longitudinally straight linear.

Example conductive lines 32 are shown to be laterally electrically isolated relative one another by dielectric material 37. Example materials are those described above for isolation regions 16. An example technique for forming conductive lines 32 is to first deposit dielectric material 37, and then form trenches therein corresponding to the desired longitudinal outlines of lines 32. Those trenches may then be overfilled with conductive material 33, followed by the polishing of conductive material 33 back at least to the elevationally outermost surfaces of dielectric material 37. Other techniques may be used.

Referring to FIGS. 13-16, mask lines 40 have been formed elevationally over conductive lines 32. Mask lines 40 angle relative to conductive lines 32 and angle relative to column line constructions 24. Mask lines 40 may be straight and/or curved and/or parallel and/or not parallel relative one another. In one embodiment, mask lines 40 are formed to not be perpendicular to either of column line constructions 24 or conductive lines 32. In one embodiment, mask lines 40 are formed to angle relative to row line constructions 18. In one embodiment, mask lines 40 are formed to not be perpendicular to any of column line constructions 24, row line constructions 18, and conductive lines 32. Mask lines 40 may be fabricated of any suitable material. Mask lines 40 may be sacrificial whereby conductive, resistive, or other electrical properties of material of mask lines 40 are not relevant. One example material for mask lines 40 is photoresist. Mask lines 40, including any other structure referred to herein, may be fabricated using pitch multiplication techniques.

In one embodiment, individual mask lines 40 where such cross elevationally over individual conductive lines 32 comprise one longitudinal edge 42 (FIGS. 13 and 15) that is over one of column line constructions 24 and another longitudinal edge 44 opposite edge 42 that is elevationally over one of elevational extensions 36 that is immediately adjacent the one column line construction 24. In one such embodiment, longitudinal edge 42 is elevationally over conductive core material 26 of the one column line construction 24.

Referring to FIGS. 17-20, etching has been conducted elevationally through longitudinally continuous portions 34 of conductive lines 32 (not numerically designated in FIGS. 17-20) and partially elevationally into extensions 36 of conductive lines 32 using mask lines 40 as a mask during such etching to form individual conductive vias 50 to substrate active area 15. In one embodiment and as shown, such act of etching also results in etching into column line constructions 24. In one embodiment and as shown, conductive vias 50 are formed to individually have planar and parallel elevationally outermost and elevationally innermost surfaces 52, 54, respectively, that are laterally displaced yet laterally overlapping relative one another.

Referring to FIGS. 21-24, mask lines 40 (not shown) have been removed.

Referring to FIGS. 25-28, dielectric 37 has been deposited and planarized back at least to elevationally outermost surface of conductive vias 50. Example materials include any of those described above for isolation regions 16. In one embodiment, charge storage devices 58 (FIGS. 26, 27) have been formed elevationally outward and individually electrically coupled to individual of conductive vias 50. Such are diagrammatically and schematically shown, in one example, as being capacitors. In one embodiment, the memory array may comprise DRAM. In one embodiment, the charge storage devices are arrayed in a 2D hexagonal close packed lattice.

Additional embodiments of the invention are next described with reference to FIG. 29 with respect to a substrate fragment 10a. Like numerals from the above-described embodiments have been used where appropriate, with some construction differences being indicated with the suffix "a" or with different numerals. Conductive vias 50a have been formed from conductive lines (not shown) comprising an elevationally outer conductive material 33a (e.g., W) and an elevationally inner conductive material 75 (e.g., TiN) that is of different composition from composition of the elevationally inner conductive material. An example thickness for inner conductive material 75 is about 50 to 250 Angstroms.

Figure 29:
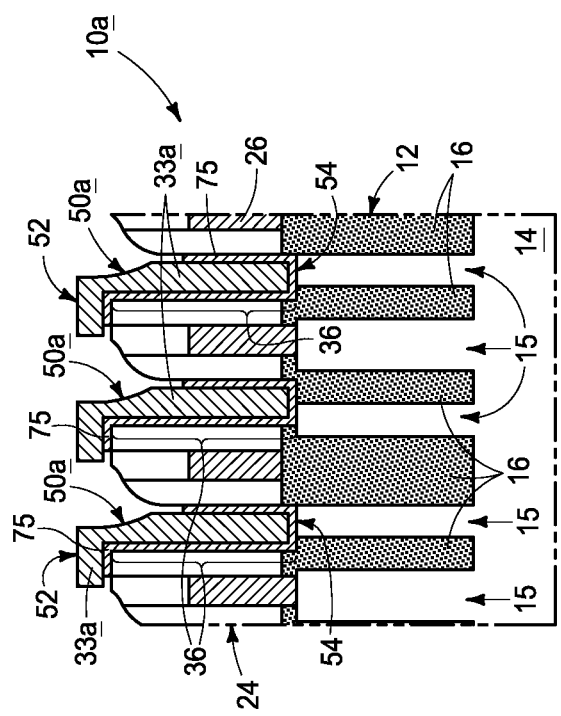
FIG. 29 is a diagrammatic sectional view of an array of conductive vias in accordance with an embodiment of the invention and of a substrate fragment in process in accordance with an embodiment of the invention, and corresponds with that of FIG. 23.

In one embodiment, lateral etching is conducted into inner conductive material 75 selectively relative to outer conductive material 33a to laterally recess inner conductive material 75 from outer conductive material 33a on at least one side (e.g., the left side in FIG. 29) of individual vias 50a in at least one straight line vertical cross section (e.g., the cross section shown by FIG. 29). In this document, a selective etch requires removal of one material relative to another stated material at a rate of at least 1.5:1. In one embodiment, elevationally etching is conducted into inner conductive material 75 selectively relative to outer conductive material 33a to elevationally recess inner conductive material 75 from a curved side surface (e.g., the surface contacted by the arrowhead at the end of a lead-line extending from a numeral 50a) of outer conductive material 33a on at least one side of via 50a (e.g., the right side in FIG. 29) in at least one straight line vertical cross section. By way of example only and where material 33a is W and material 75 is TiN, W and TiN may be anisotropically etched non-selectively using plasma-based $SF_6$ and/or $CF_4$ chemistry to produce an outline of the vias largely corresponding to those shown by vias 50 in FIGS. 17-19. This may be followed by a plasma-based $Cl_2$ chemistry to isotropically etch TiN selectively relative to W to produce the FIG. 29 construction. Any other attribute(s) or construction(s) as described above may be used.

Embodiments of the invention encompass methods of forming conductive vias independent of whether such are formed in association with memory circuitry. In one such embodiment, at least three spaced (i.e., in at least one vertical straight-line cross section) line constructions (e.g., constructions 24) are formed elevationally over a substrate. The line constructions individually comprise a dielectric top and dielectric sidewalls. A plurality of conductive lines (e.g., lines 32) is formed elevationally over and that angle relative to the line constructions. The conductive lines individually comprise a longitudinally continuous portion and a plurality of conductive material extensions that individually extend elevationally inward between immediately adjacent of the line constructions. Mask lines (e.g., lines 40) are formed elevationally over the conductive lines. The mask lines angle relative to the conductive lines and angle relative to the line constructions. Etching is conducted elevationally through the longitudinally continuous portions and partially elevationally into the extensions using the mask lines as a mask during such etching to form individual conductive vias (e.g., vias 50) extending elevationally between immediately adjacent of the line constructions. Any other attribute(s) or construction(s) as described above may be used.

In one embodiment, a method of forming conductive vias comprises forming at least three spaced line constructions (e.g., constructions 24) elevationally over a substrate. The line constructions individually comprise a dielectric top and dielectric sidewalls. A conductive line (e.g., a line 32) is formed elevationally over and angles relative to the line constructions. The conductive line comprises a longitudinally continuous portion and a plurality of conductive material extensions that individually extend elevationally inward between immediately adjacent of the line constructions. Etching is conducted elevationally through the longitudinally continuous portion and partially elevationally into the extensions at spaced locations (e.g., some locations that are between immediately adjacent mask lines 40 as in FIG. 19) along the conductive line to break-up the longitudinally continuous portion to form individual conductive vias (e.g., vias 50) extending elevationally between immediately adjacent of the line constructions. In one embodiment, an etch mask (e.g., a mask formed by lines 40) that is over the conductive lines between the spaced locations is used during the etching. In one embodiment, the etch mask is formed to comprise spaced masking regions (e.g., the regions of mask lines 40 as in FIG. 19) individually comprising one longitudinal edge that is over one of the line constructions and another longitudinal edge opposite the one edge that is elevationally over one of the extension that is immediately adjacent the one line construction. Any other attribute(s) or construction(s) as described above may be used.

In one embodiment, a method of forming a memory array comprises using one masking step to pattern conductive storage node vias (e.g., conductive storage node vias comprising the elevationally innermost portion of vias 50) and conductive laterally redistributing material (e.g., conductive laterally redistributing material comprising the elevationally outermost portion of vias 50 above line constructions 24, and the masking step and patterning shown by FIGS. 13-20). Any other attribute(s) or construction(s) as described above may be used.

In one embodiment, a method of forming a memory array comprises using a conductive storage node via mask also as a self-aligned conductive laterally redistributing material mask (e.g., the mask shown by lines 40 in FIGS. 13-20 to form conductive storage node vias comprising the elevationally innermost portion of vias 50 and conductive laterally redistributing material comprising the elevationally outermost portion of vias 50 above line constructions 24). In the context of this document, "self-aligned" means a technique whereby at least a lateral surface of a structure is defined by deposition of material against a sidewall of a previously patterned structure. In one such embodiment, the storage node via and redistributing material mask is self-aligned along one direction that is between immediately adjacent conductive line constructions and between which is the redistributing material and material of the vias (e.g., conductive material 33 is self-aligned to and by sidewall material 30 between immediately adjacent line constructions 24 along a direction such as line 19-19 in FIG. 17). Any other attribute(s) or construction(s) as described above may be used.

Embodiments of the invention include an array of conductive vias independent of method of manufacture, and for example as shown in FIG. 29. In one embodiment, an array of conductive vias comprises spaced line constructions (e.g., constructions 24) individually comprising a dielectric top and dielectric sidewalls. Individual conductive vias (e.g., vias 50a) extend elevationally between immediately adjacent of the line constructions. The individual vias comprise an elevationally inner conductive material (e.g., material 75) and an elevationally outer conductive material (e.g., material 33a) of different composition from composition of the elevationally inner conductive material. The elevationally inner conductive material is laterally recessed from the elevationally outer conductive material on at least one side of the individual via in at least one straight line vertical cross section. Other attribute(s) or construction(s) as described above may be used.

In one embodiment, an array of conductive vias comprises spaced line constructions (e.g., constructions 24) individually comprising a dielectric top and dielectric sidewalls. Individual conductive vias (e.g., vias 50a) extend elevationally between immediately adjacent of the line constructions. The individual vias comprise an elevationally inner conductive material (e.g., material 75) and an elevationally outer conductive material (e.g., material 33a) of different composition from composition of the elevationally inner conductive material. The elevationally inner conductive material is elevationally recessed from a curved side surface of the elevationally outer conductive material on at least one side of the individual via in at least one straight line vertical cross section. Other attribute(s) or construction(s) as described above may be used.

CONCLUSION

In some embodiments, a method of forming a memory array comprises forming row line constructions and column line constructions relative to a substrate, the row line constructions and the column line constructions angling relative one another. The column line constructions are elevationally outward of the row line constructions. The column line constructions individually comprise a conductive core and dielectric over a top and over sidewalls of the conductive core. Conductive lines are formed elevationally over and that angle relative to the column line constructions. The conductive lines individually comprise a longitudinally continuous portion and a plurality of conductive material extensions that individually extend elevationally inward between immediately adjacent of the column line constructions to electrically couple to substrate active area. Mask lines are formed elevationally over the conductive lines. The mask lines angle relative to the conductive lines and angle relative to the column line constructions. Etching is conducted elevationally through the longitudinally continuous portions and partially elevationally into the extensions using the mask lines as a mask during said etching to form individual conductive vias that electrically couple to the substrate active area.

In some embodiments, a method of forming conductive vias comprises forming at least three spaced line constructions elevationally over a substrate. The line constructions individually comprise a dielectric top and dielectric sidewalls. A plurality of conductive lines is formed elevationally over and that angle relative to the line constructions. The conductive lines individually comprise a longitudinally continuous portion and a plurality of conductive material extensions that individually extend elevationally inward between immediately adjacent of the line constructions. Mask lines are formed elevationally over the conductive lines. The mask lines angle relative to the conductive lines and angle relative to the line constructions. Etching is conducted elevationally through the longitudinally continuous portions and partially elevationally into the extensions using the mask lines as a mask during said etching to form individual conductive vias extending elevationally between immediately adjacent of the line constructions.

In some embodiments, a method of forming conductive vias comprises forming at least three spaced line constructions elevationally over a substrate. The line constructions individually comprise a dielectric top and dielectric sidewalls. A conductive line is formed elevationally over and angles relative to the line constructions. The conductive line comprises a longitudinally continuous portion and a plurality of conductive material extensions that individually extend elevationally inward between immediately adjacent of the line constructions. Etching is conducted elevationally through the longitudinally continuous portion and partially elevationally into the extensions at spaced locations along the conductive line to break-up the longitudinally continuous portion to form individual conductive vias extending elevationally between immediately adjacent of the line constructions.

In some embodiments, a method of forming a memory array comprises using one masking step to pattern conductive storage node vias and conductive laterally redistributing material.

In some embodiments, a method of forming a memory array comprises using a conductive storage node via mask also as a self-aligned conductive laterally redistributing material mask.

In some embodiments, an array of conductive vias comprises spaced line constructions individually comprising a dielectric top and dielectric sidewalls. Individual conductive vias extend elevationally between immediately adjacent of the line constructions. The individual vias comprise an elevationally inner conductive material and an elevationally outer conductive material of different composition from composition of the elevationally inner conductive material. The elevationally inner conductive material is laterally recessed from the elevationally outer conductive material on at least one side of the individual via in at least one straight line vertical cross section.

In some embodiments, an array of conductive vias comprises spaced line constructions individually comprising a dielectric top and dielectric sidewalls. Individual conductive vias extend elevationally between immediately adjacent of the line constructions. The individual vias comprise an elevationally inner conductive material and an elevationally outer conductive material of different composition from composition of the elevationally inner conductive material. The elevationally inner conductive material is elevationally recessed from a curved side surface of the elevationally outer conductive material on at least one side of the individual via in at least one straight line vertical cross section.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a memory array comprising using one masking step to pattern conductive storage node vias and conductive laterally redistributing material there-over followed by forming charge storage devices elevationally outward of and individually electrically coupled to individual of the conductive vias through the conductive laterally redistributing material, wherein forming the charge storage devices comprises depositing a capacitor insulator elevationally outward of the conductive laterally redistributing material and depositing conductor material elevationally outward of the capacitor insulator to form the charge storage devices to be capacitors.

2. A method of forming a memory array comprising using a conductive storage node via mask also as a self-aligned conductive laterally redistributing material mask followed by forming charge storage devices elevationally outward of and individually electrically coupled to individual of the conductive vias through the conductive laterally redistributing material, wherein forming the charge storage devices comprises depositing a capacitor insulator elevationally outward of the conductive laterally redistributing material and depositing conductor material elevationally outward of the capacitor insulator to form the charge storage devices to be capacitors.

3. A method of forming a memory array comprising using a conductive storage node via mask also as a self-aligned conductive laterally redistributing material mask, the storage node via and redistributing material mask being self-aligned along one direction that is between immediately adjacent conductive line constructions and between which is the redistributing material and material of the vias.

4. A method of forming a memory array, comprising:
forming row line constructions and column line constructions relative to a substrate, the row line constructions and the column line constructions angling relative one another, the column line constructions being elevationally outward of the row line constructions, the column line constructions individually comprising a conductive core and dielectric over a top and over sidewalls of the conductive core;
forming conductive lines elevationally over and that angle relative to the column line constructions, the conductive lines individually comprising a longitudinally continuous portion and a plurality of conductive material extensions that individually extend elevationally inward between immediately adjacent of the column line constructions to electrically couple to substrate active area;
forming mask lines elevationally over the conductive lines, the mask lines angling relative to the conductive lines and angling relative to the column line constructions; and
etching elevationally through the longitudinally continuous portions and partially elevationally into the extensions using the mask lines as a mask during said etching to form individual conductive vias that electrically couple to the substrate active area.

5. The method of claim 4 comprising forming charge storage devices elevationally outward and individually electrically coupled to individual of the conductive vias.

6. The method of claim 5 wherein the charge storage devices are arrayed in a 2D hexagonal close packed lattice.

7. The method of claim 4 wherein the conductive lines are formed parallel relative to the row line constructions.

8. The method of claim 7 wherein at least a majority of all conductive material of the conductive lines is between immediately adjacent of the row line constructions elevationally outward of the row line constructions.

9. The method of claim 4 wherein the conductive lines are formed to angle perpendicularly relative to the column line constructions.

10. The method of claim 9 wherein the column line constructions are formed to angle perpendicularly relative to the row line constructions.

11. The method of claim 10 wherein at least a majority of all conductive material of the conductive lines is between immediately adjacent of the row line constructions elevationally outward of the row line constructions.

12. The method of claim 4 wherein all conductive material of the individual conductive lines is formed to be homogenous.

13. The method of claim 4 wherein the conductive lines comprise an elevationally inner conductive material and an elevationally outer conductive material that is of different composition from composition of the elevationally inner conductive material, and comprising laterally etching into the inner conductive material selectively relative to the outer conductive material to laterally recess the inner conductive material from the outer conductive material on at least one side of the individual vias in at least one straight line vertical cross section.

14. The method of claim 4 wherein the conductive lines comprise an elevationally inner conductive material and an elevationally outer conductive material that is of different composition from composition of the elevationally inner conductive material, and comprising elevationally etching into the inner conductive material selectively relative to the outer conductive material to elevationally recess the inner conductive material from a curved side surface of the outer conductive material on at least one side of the individual vias in at least one straight line vertical cross section.

15. The method of claim 4 wherein the mask lines are formed to not be perpendicular to either of the column line constructions or the conductive lines.

16. The method of claim 4 wherein the mask lines are formed to angle relative to the row line constructions.

17. The method of claim 16 wherein the mask lines are formed to not be perpendicular to any of the column line constructions, the row line constructions, and the conductive lines.

18. The method of claim 4 comprising etching into the column line constructions while etching partially elevationally into the extensions.

19. The method of claim 4 comprising forming individual mask lines where such cross elevationally over individual conductive lines to comprise one longitudinal edge that is over one of the column line constructions and another longitudinal edge opposite the one edge that is elevationally over one of the extensions that is immediately adjacent the one column line construction.

20. The method of claim 19 wherein the one longitudinal edge is elevationally over the conductive core of the one column line construction.

21. The method of claim 4 comprising forming the conductive vias to individually have planar and parallel elevationally outermost and elevationally innermost surfaces that are laterally displaced yet laterally overlapping relative one another.

22. A method of forming conductive vias, comprising:
forming at least three spaced line constructions elevationally over a substrate, the line constructions individually comprising a dielectric top and dielectric sidewalls;
forming a plurality of conductive lines elevationally over and that angle relative to the line constructions, the conductive lines individually comprising a longitudinally continuous portion and a plurality of conductive material extensions that individually extend elevationally inward between immediately adjacent of the line constructions;
forming mask lines elevationally over the conductive lines, the mask lines angling relative to the conductive lines and angling relative to the line constructions; and
etching elevationally through the longitudinally continuous portions and partially elevationally into the extensions using the mask lines as a mask during said etching to form individual conductive vias extending elevationally between immediately adjacent of the line constructions.

23. The method of claim 22 comprising forming individual mask lines where such cross elevationally over individual conductive lines to comprise one longitudinal edge that is over one of the line constructions and another longitudinal edge opposite the one edge that is elevationally over one of the extensions that is immediately adjacent the one line construction.

24. The method of claim 22 comprising forming the conductive vias to individually have planar and parallel elevationally outermost and elevationally innermost surfaces that are laterally displaced yet laterally overlapping relative one another.

25. The method of claim 22 wherein the mask lines are formed to not be perpendicular to either of the column line constructions or the conductive lines.

26. The method of claim 22 comprising etching into the line constructions while etching partially elevationally into the extensions.

27. A method of forming conductive vias, comprising:
forming at least three spaced line constructions elevationally over a substrate, the line constructions individually comprising a dielectric top and dielectric sidewalls;
forming a conductive line elevationally over and angling relative to the line constructions, the conductive line comprising a longitudinally continuous portion and a plurality of conductive material extensions that individually extend elevationally inward between immediately adjacent of the line constructions; and
etching elevationally through the longitudinally continuous portion and partially elevationally into the extensions at spaced locations along the conductive line to break-up the longitudinally continuous portion to form individual conductive vias extending elevationally between immediately adjacent of the line constructions.

28. The method of claim 27 comprising forming the conductive vias to individually have planar and parallel elevationally outermost and elevationally innermost surfaces that are laterally displaced yet laterally overlapping relative one another.

29. The method of claim 27 comprising using an etch mask over the conductive line between the spaced locations during the etching.

30. The method of claim 29 comprising forming the etch mask to comprise spaced masking regions individually comprising one edge that is over one of the line constructions and another longitudinal edge opposite the one edge that is elevationally over one of the extensions that is immediately adjacent the one line construction.

* * * * *